(12) United States Patent
Izikson

(10) Patent No.: US 7,873,585 B2
(45) Date of Patent: Jan. 18, 2011

(54) APPARATUS AND METHODS FOR PREDICTING A SEMICONDUCTOR PARAMETER ACROSS AN AREA OF A WAFER

(75) Inventor: Pavel Izikson, Haifa (IL)

(73) Assignee: KLA-Tencor Technologies Corporation, Milpitas, CA (US)

( * ) Notice: Subject to any disclaimer, the term of this patent is extended or adjusted under 35 U.S.C. 154(b) by 616 days.

(21) Appl. No.: 11/955,262

(22) Filed: Dec. 12, 2007

(65) Prior Publication Data
US 2009/0063378 A1    Mar. 5, 2009

Related U.S. Application Data

(60) Provisional application No. 60/969,291, filed on Aug. 31, 2007.

(51) Int. Cl.
G06F 15/18 (2006.01)
G06E 1/00 (2006.01)
G06E 3/00 (2006.01)
G06G 7/00 (2006.01)

(52) U.S. Cl. ............................................. 706/21
(58) Field of Classification Search .................. 706/21
See application file for complete search history.

(56) References Cited

U.S. PATENT DOCUMENTS

| | | | | |
|---|---|---|---|---|
| 5,444,820 A | * | 8/1995 | Tzes et al. | .................... 706/21 |
| 6,028,994 A | | 2/2000 | Peng et al. | |
| 6,157,907 A | * | 12/2000 | Taori et al. | .................... 704/221 |
| 6,560,503 B1 | | 5/2003 | Toprac et al. | |
| 6,694,498 B2 | | 2/2004 | Conrad et al. | |
| 6,704,920 B2 | | 3/2004 | Brill et al. | |
| 6,716,649 B2 | | 4/2004 | Ziger | |
| 6,735,492 B2 | | 5/2004 | Conrad et al. | |
| 7,068,833 B1 | | 6/2006 | Ghinovker et al. | |
| 7,403,264 B2 | | 7/2008 | Jeunik et al. | |
| 7,567,351 B2 | * | 7/2009 | Opsal et al. | .................. 356/625 |
| 2004/0038455 A1 | | 2/2004 | Seligson et al. | |
| 2007/0021860 A1 | | 1/2007 | Simons et al. | |

FOREIGN PATENT DOCUMENTS

JP    2006-061633    9/2007

OTHER PUBLICATIONS

TDNN-LR continuous speech recognition system using adaptive incremental TDNN training, Sawai, H.; Acoustics, Speech, and Signal Processing, 1991. ICASSP-91., 1991 International Conference on Digital Object Identifier: 10.1109/ICASSP.1991.150276 Publication Year: 1991 , pp. 53-56 vol. 1.*

(Continued)

*Primary Examiner*—Michael Holmes
(74) *Attorney, Agent, or Firm*—Weaver Austin Villeneuve & Sampson LLP

(57) ABSTRACT

Apparatus and methods are provided for predicting a plurality of unknown parameter values (e.g. overlay error or critical dimension) using a plurality of known parameter values. In one embodiment, the method involves training a neural network to predict the plurality of parameter values. In other embodiments, the prediction process does not depend on an optical property of a photolithography tool. Such predictions may be used to determine wafer lot disposition.

26 Claims, 10 Drawing Sheets

OTHER PUBLICATIONS

Zhou et al., "Advanced Lithography Parameters Extraction by Using Scatterometry System", Metrology, Inspection, and Process Control for Microlithography XXI, edited by Chas N. Archie Proc. Of SPIE vol. 6518, 651823, (Apr. 5, 2007) 0277-786X/07, doi: 10.1117/12.702270.

Dusa, Mircea, et al, "Intra-wafer CDU characterization to determine process and focus contributions based on Scatterometry Metrology." Data Analysis and Modeling for Process Control, edited by Kenneth W. Tobin, Jr., Proc. of SPIE vol. 5378 (SPIE, Bellingham, WA, 2004) 0277-786X/04, doi:10.1117/12.543786, pp. 93-104.

Valley, John, et al. "Approaching New Metrics for Wafer Flatness: An Investigation of the Lithographic Consequences of Wafer Non-Flatness," Metrology, Inspection, and Process Control for Microlithography XVIII, edited by Richard M. Silver, Proceedings of SPIE vol. 5375 (SPIE, Bellingham, WA, 2004) Rev11 ADE Confidential Draft, 0277-786X/04, doi: 10.1117/12.536092, pp. 1098-1108.

U.S. Appl. No. 10/950,172 entitled "Apparatus and Methods for Determining Overlay and Uses of Same," Ghinovker et al, filed Sep. 23, 2004.

International Search Report and Written Opinion mailed on Feb. 11, 2009 for PCT Application No. PCT/US2008/074872.

* cited by examiner

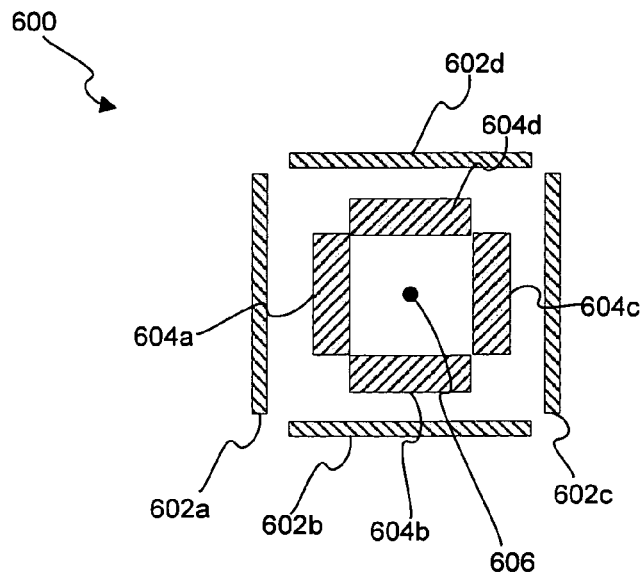
Figure 6A
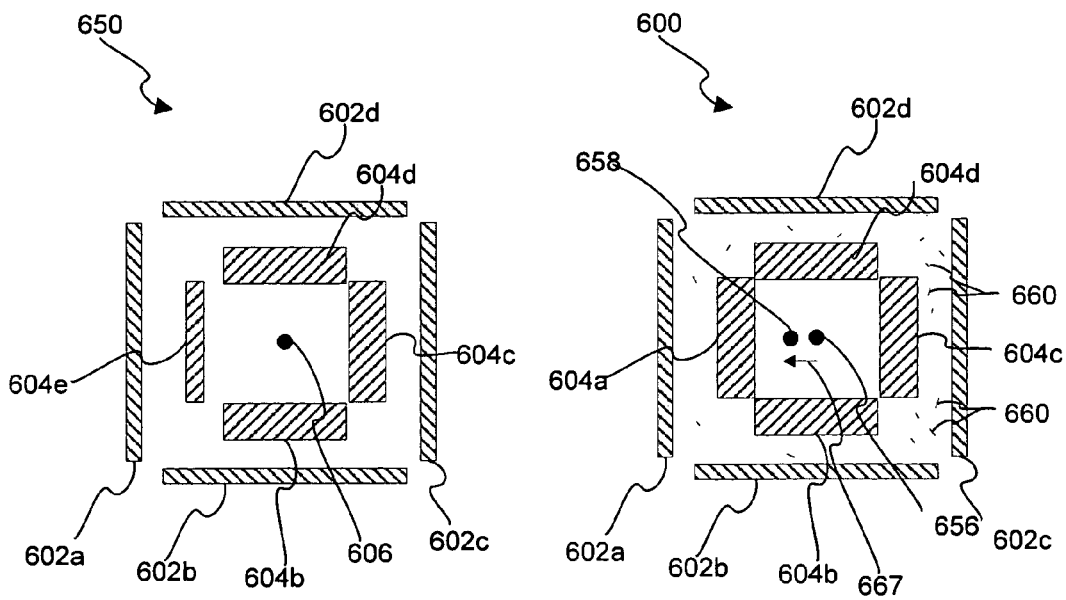
Figure 6B
Figure 6C

APPARATUS AND METHODS FOR PREDICTING A SEMICONDUCTOR PARAMETER ACROSS AN AREA OF A WAFER

CROSS REFERENCE TO RELATED PATENT APPLICATION

This application claims priority of U.S. Provisional Patent Application No. 60/969,291 filed 31 Aug. 2007 by Pavel Izikson, which is incorporated herein by reference in its entirety for all purposes.

BACKGROUND OF THE INVENTION

The present invention relates to approximation techniques used in semiconductor manufacturing processes. More particularly, it relates to the prediction of unknown parameters of a wafer.

In the semiconductor manufacturing industry, there is a need to measure and predict certain wafer parameters. One such parameter is overlay error. Overlay error refers to the relative position of structures on different layers of a wafer. The greater the overlay error, the more the structures are misaligned. If the overlay error over an entire wafer is too great, the performance of an electronic device incorporating the wafer may be reduced. In a process referred to as lot dispositioning, semiconductor manufacturers determine the overlay error of a sample wafer taken from a lot of wafers. If the overlay error across the sample wafer does not meet a certain standard, the lot may be discarded.

Approximating the overlay error across an entire wafer typically involves the use of target structures. A lithography tool forms target structures at various locations on the wafer. The target structures may take many forms, such as a box in box structure. In this form, a box is created on one layer of the wafer and a second, smaller box is created on anther layer. The localized overlay error is measured by comparing the alignment between the centers of the two boxes. Such measurements are taken at locations on the wafer where target structures are available.

To properly evaluate a wafer, approximations of the overlay error at other locations may also be needed. To generate such approximations, the above measurements may be inputted into a model, such as a higher order linear model. The approximations may then be used as part of the lot dispositioning process.

The conventional models used for such approximations, however, have limitations. The models, for example, may depend on unpredictable variables, such as the optical properties of a lithography tool. The models also may have problems identifying the often complex relationships between large numbers of inputs and outputs. Therefore, in light of the deficiencies of existing approaches to the prediction of parameters for a wafer, there is a need for an approach that overcomes some of the problems of the prior art.

SUMMARY OF THE INVENTION

Accordingly, the present invention provides apparatus and methods for predicting a plurality of unknown parameter values (e.g. overlay error or critical dimension) using a plurality of known parameter values. In one embodiment, the method involves training a neural network to predict the plurality of parameter values. In other embodiments, the prediction process does not depend on an optical property of a photolithography tool. Such predictions may be used to determine wafer lot disposition.

In a specific example implementation, a method of predicting a plurality of parameter values distributed over at least a portion of wafer is disclosed. The predicted parameter values may be distributed across the entire wafer or across a field of the wafer. The predicted parameter values may comprise a plurality of overlay error values or a plurality of critical dimension values. A plurality of known parameter values are provided. The known parameter values are measured from a plurality of targets at specific measurement locations on the wafer. In a training operation, a neural network is trained using the measured, known parameter values so that the trained neural network is configured to predict a plurality of predicted parameter values such that a subset of the predicted parameter values which correspond to the specific measurement locations are within a predefined error function of the corresponding measured, known parameter values. In a using operation, the trained neural network is used to predict the predicted parameter values at the plurality of locations distributed across at least a portion of the wafer.

In a specific embodiment, the training and using operations may include inputting an alignment metric from a photolithography tool into the neural network and the trained neural network. The training and using operations may include inputting at least one process metric that characterizes a property of the wafer into the neural network and the trained neural network. The training and using operations may include inputting (i) at least one noise metric that quantifies a background characteristic of at least one target of the wafer, (ii) at least one systematic metric of the at least one target of the wafer, (iii) an alignment metric from a photolithographic tool and (iv) at least one process metric into the neural network and the trained neural network. In a determining operation, the passage or failure of the wafer is determined based on the predicted parameter values predicted by the trained neural network.

In one implementation, the training and using operations may include inputting at least one target metric of at least one of the targets of the wafer into the neural network and the trained neural network. In a further aspect, the at least one target metric may include a noise metric that quantifies a background characteristic of the at least one target of the wafer. The at least one target metric may include a systematic metric of the at least one target of the wafer.

In another implementation, the invention pertains to a method of predicting a plurality of parameter values distributed over at least a portion of a wafer. The method comprises providing and predicting operations. The providing operation involves providing a plurality of known parameter values measured from a plurality of targets at specific measurement locations on the wafer. The predicting operation involves predicting a plurality of unknown parameter values at a plurality of locations that are distributed across at least a portion of the wafer. The predicting operation is based on the known parameter values without depending on an optical property of a photolithographic tool. The predicting operation may be performed without use of a model of the lithography tool. The optical property may include a lens aberration characteristic.

In another implementation, the invention pertains to an apparatus for predicting a plurality of parameter values distributed over at least a portion of a wafer. The predicted parameter values may be distributed across the entire wafer or across a field of the wafer. The predicted parameter values may comprise a plurality of overlay error values. The predicted parameter values may comprise a plurality of critical dimension values. The apparatus comprises one or more processors and one or more memory. At least one of the processors and memory are configured to perform one or more of the above described method operations.

These and other features of the present invention will be presented in more detail in the following specification of the invention and the accompanying figures which illustrate by way of example the principles of the invention.

BRIEF DESCRIPTION OF THE DRAWINGS

FIG. 6A is a diagrammatic top view of an example target structure.

FIG. 6B is a diagrammatic top view of an example target structure that is asymmetrical.

FIG. 6C is a diagrammatic top view of the target of FIG. 6A with a noisy background.

DETAILED DESCRIPTION OF SPECIFIC EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
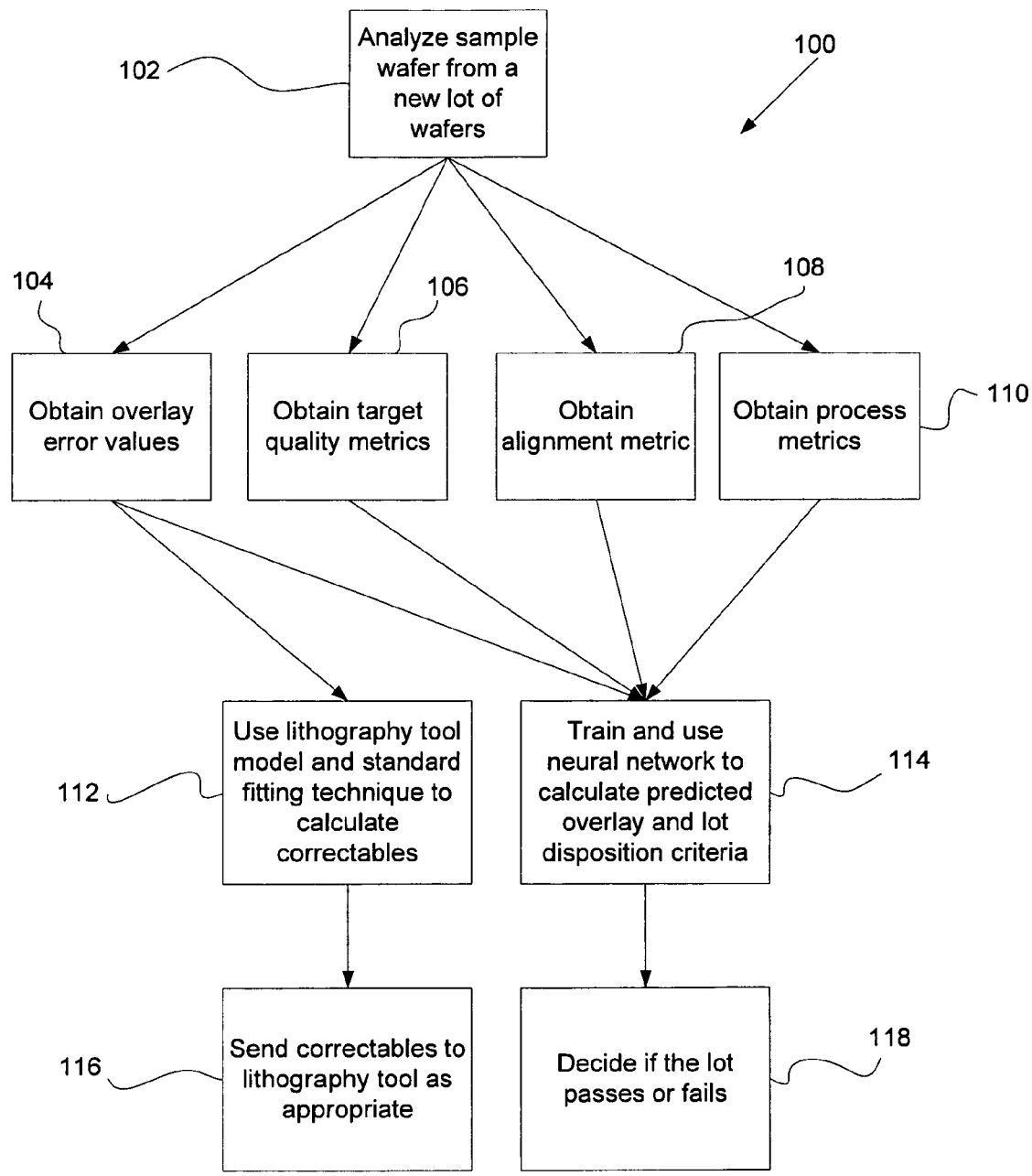
FIG. 1 is a diagrammatic representation of an example procedure for training a neural network and using the neural network to predict overlay error in accordance with one embodiment of the present invention.

FIG. 1 is a diagrammatic representation of an example procedure for training an example neural network and using the neural network to predict overlay error. The method begins with block 102, where a sample wafer is taken from a new lot of wafers. In block 102, the sample wafer is analyzed. From this analysis, various metric are obtained in blocks 106, 108 and 110. In block 106, target quality metrics are obtained from the wafer. The target quality metrics quantify background characteristics of targets on the wafer, such as asymmetry and noise. In block 108, an alignment metric is obtained from the wafer. The alignment metric comes from the lithography tool used to form structures on the wafer. In block 110, process metrics are obtained from the wafer. Process metrics may characterize the smoothness (or roughness) level of the wafer or a layer of such wafer.

These metrics are then inputted into the example neural network in block 114. The neural network is an adaptive, self-training function relating inputs to outputs. The neural network in block 114 must be trained before it can predict unknown parameters of the wafer. If the neural network is being trained, it receives additional parameters. In block 104, values for the overlay error at various locations on the wafer are obtained. A variety of techniques and tools may be used to obtain the overlay error values, including a scanning electron microscope (SEM) or an optical imaging tool. These overlay error values are used in block 112 to calculate correctables that in block 114 are sent to the lithography tool to improve the lithography tool's performance. The overlay error values are also inputted into the untrained neural network, as shown by the arrow extending from block 104 to block 114. The untrained neural network uses the inputs collected from blocks 104, 106, 108 and 110 to improve its predictive capability.

If the neural network has already been trained, then the neural network in block 114 no longer needs to receive input from block 104, e.g., overlay error values. In block 114, the trained neural network is used to predict the overlay error from the metrics obtained in blocks 106, 108 and 110. Based on the predicted value for the sample wafer, a determination is made in block 118 as to whether the lot should pass or fail.

The blocks of procedure 100 may be reconfigured in a variety of ways. The neural network in block 114 may receive different or additional inputs from the ones obtained in blocks 106, 108 and 110. The neural network in block 114 may be trained to predict parameters other than overlay error, such as critical dimension. In that case, block 104 would approximate values for the desired parameters, instead of overlay error.

Figure 2:
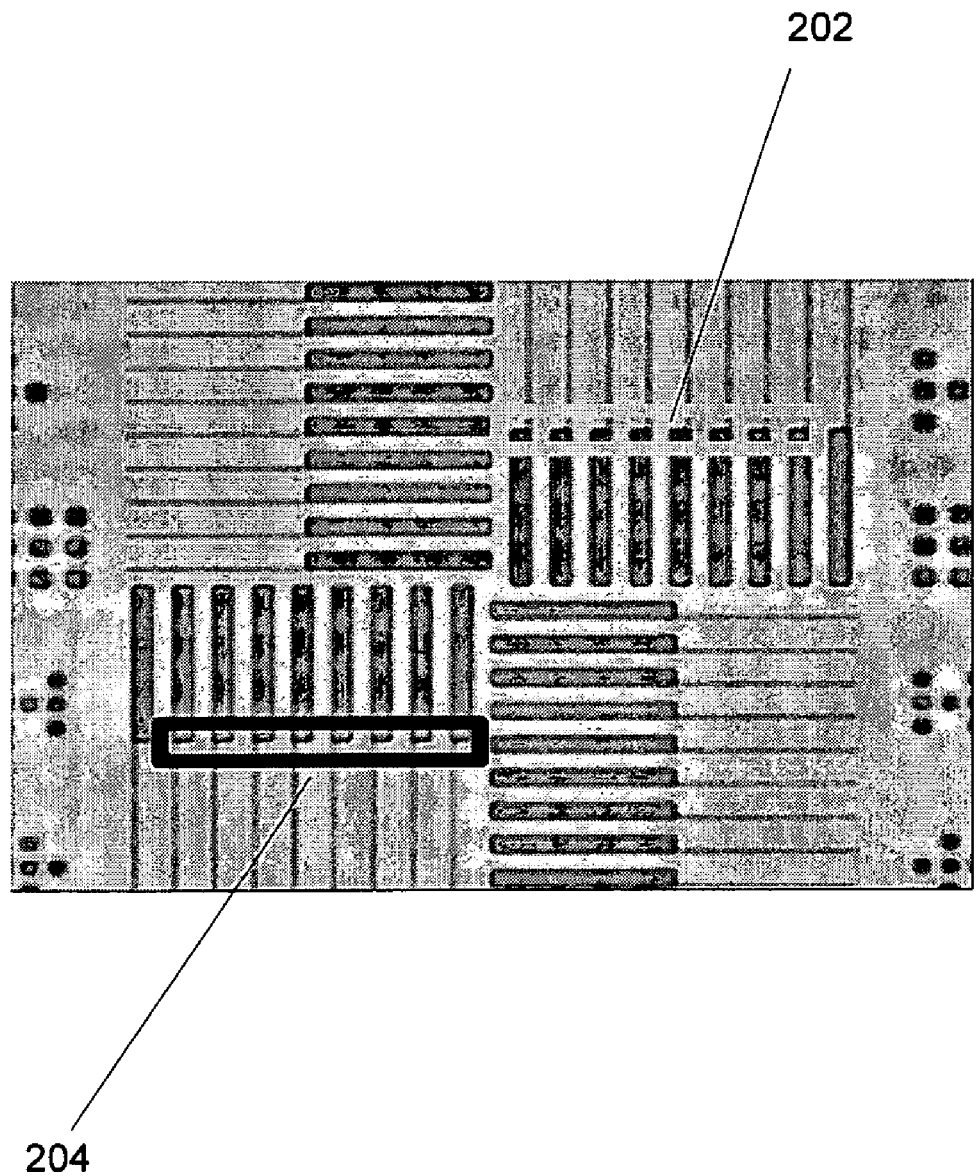
FIG. 2 is a top view photographic image of overlay patterns which are also imaged with a scanning electron microscope (SEM) in accordance with one embodiment of the present invention.

The measurement of overlay error in block 104 may involve a variety of different techniques and tools, some of which are presented in FIGS. 2, 3A and 3B, 4 and 5. The overlay is measured on a specially designed target with the following built-in symmetry. The regions of interest (ROIs) that are used for the target contain junctions between the structures or layers between which the overlay is to be measured. FIG. 2 is a top view of a target image that can be measured with an SEM in accordance with one embodiment of the present invention. As shown, these structures are formed from arrays of thick inner and thin outer bars.

In this example, the structures in the regions-of-interest (ROIs) 202 and 204 are identical up to 180° rotation around the point called center of symmetry (COS). Overlay (or pattern placement errors) leads to separation between the COSs of inner and outer patterns. The overlay can be defined as this misregistration between the COSs of inner and outer patterns. In general, the overlay can be measured by locating the COSs of both inner and outer patterns.

Figure 3A:
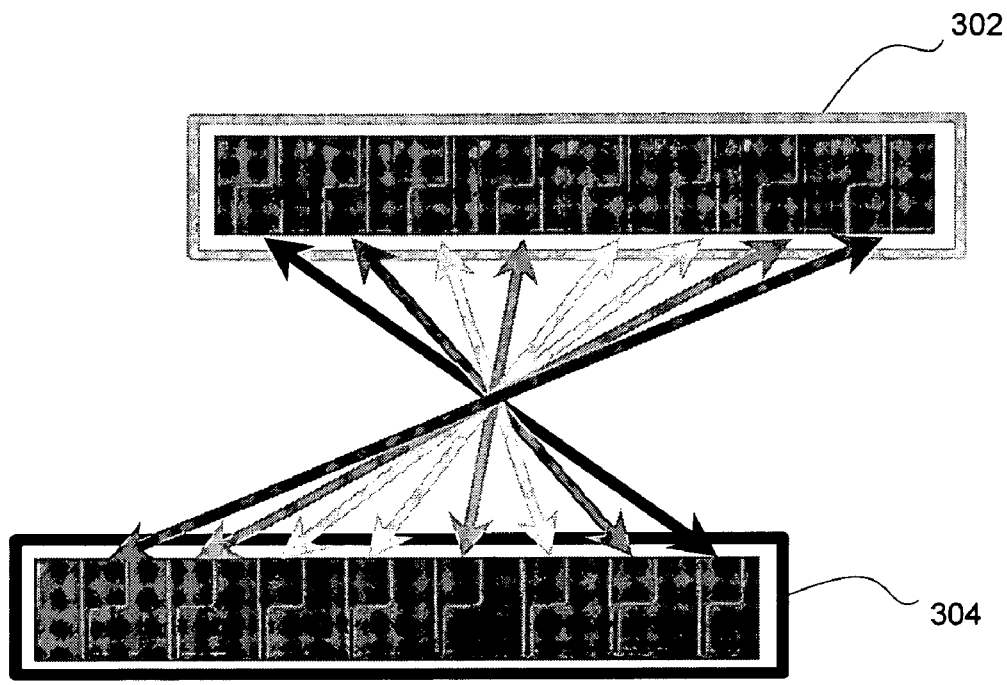
FIG. 3A is top view photographic images of symmetrical overlay pattern portions which are also imaged with a scanning electron microscope (SEM) in accordance with one embodiment of the present invention.

In a first technique, overlay is based upon an edge detection process. A series of the SEM images are grabbed and analyzed from the consecutive junctions of inner and outer lines (as shown in FIG. 3A). FIG. 3A illustrates the conjunctions of ROI 302 and 304 of the target of FIG. 3A. Each SEM image in the ROI 302 has a complementary (symmetric by design) image from the ROI 304 as illustrated by the areas between the two ROIs.

Figure 3B:
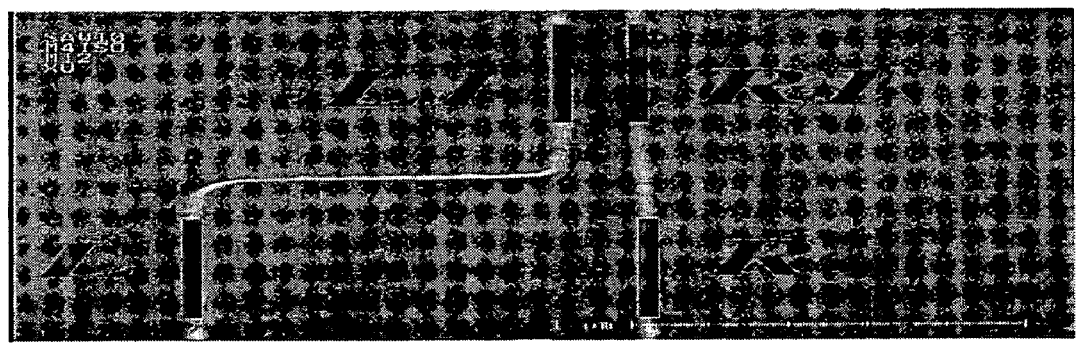
FIG. 3B is top view photographic image of a portion of an overlay pattern which is imaged with a scanning electron microscope (SEM) and wherein different edges are used to analyze the image portion in accordance with a specific implementation of the present invention.

In this method, each particular junction in the ROI ("SEM image") is analyzed to detect the edges (see FIG. 3B). Comparing between the edge from the ROI 302 and its complementary couple from the ROI 304 gives their COS position. Although the absolute position of the COS cannot be measured, the relative position of COSs for inner and outer edges can be detected, thus producing the overlay result.

Utilization of multiple edges from the whole ROI improves the statistics thus reducing the contribution of random error to the measurement. Separate treatment of physically different edges ("L" vs. "R", for example) enables the monitoring of overlay effect on chosen lines or edges. Measuring overlay at various wafer orientations (0°, 90°, 180°) allows discrimination of the real overlay from the tool influence—tool induced shifts (TIS; 0° vs. 180°) or rotation induced shift (RIS; 0° vs. 90°).

Figure 4:
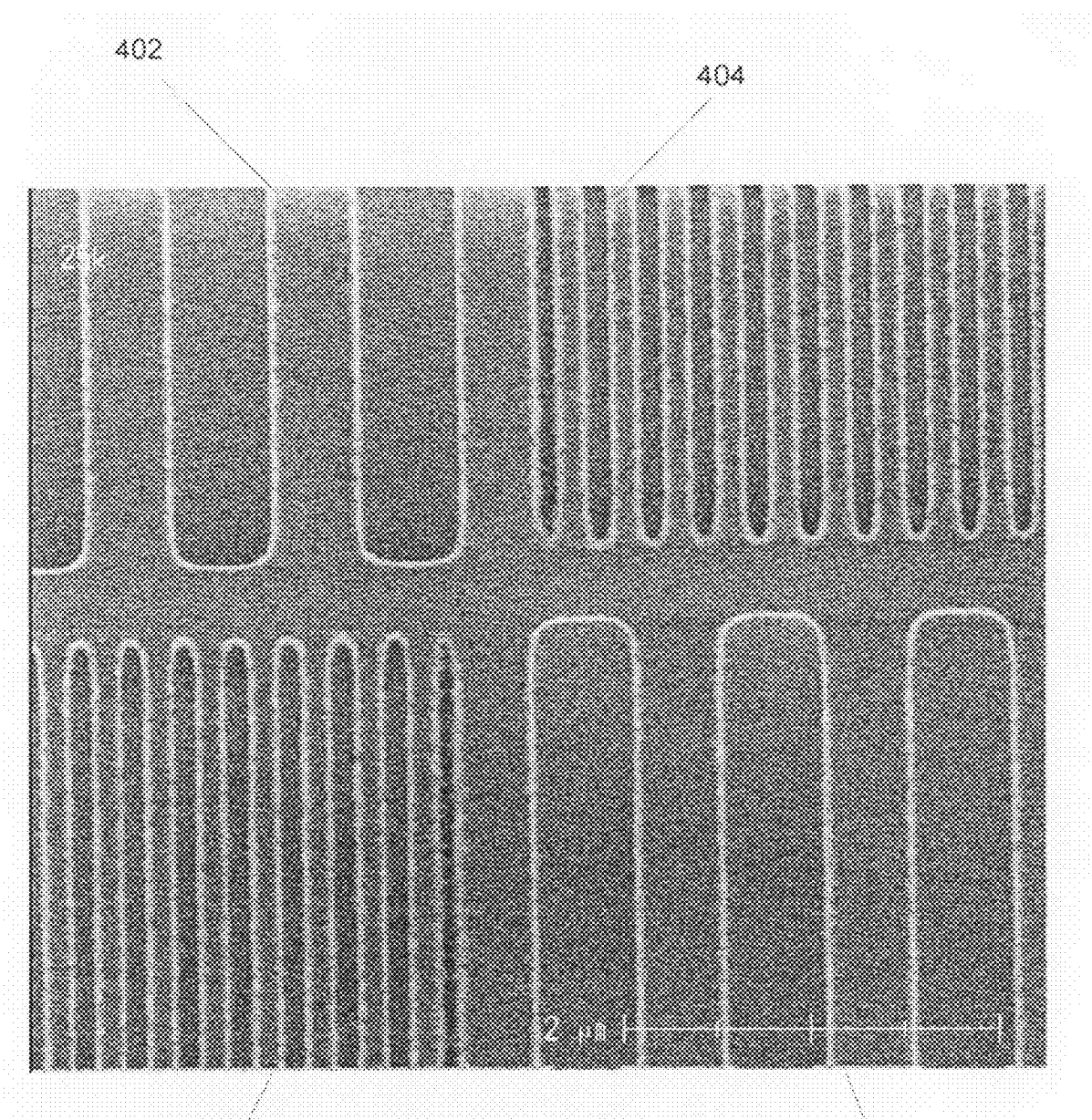
FIG. 4 is a top view photographic image of a portion of an SEM overlay pattern for correlation based overlay measurements in accordance with one embodiment of the present invention.

Another method is based upon correlation. This SEM overlay target also has both Layer1 and Layer2 structures that are to be symmetric with coinciding—by design—centers of symmetry. FIG. 4 is a top view photographic image of a portion of an SEM overlay pattern for correlation based overlay measurements in accordance with one embodiment of the present invention. The whole signals grabbed from the ROIs (boxes 402, 404, 406, and 408 of FIG. 4) are analyzed.

The signals in complementary ROIs (box 404 vs. rotated box 408; box 406 vs. rotated box 402) can be compared (either by two-dimensional correlation or by summing up in the vertical direction with subsequent one-dimensional correlation) to locate the COSs of Layer1 and Layer2 structures. The misregistration between the COSs may be defined as the overlay result.

Figure 5:
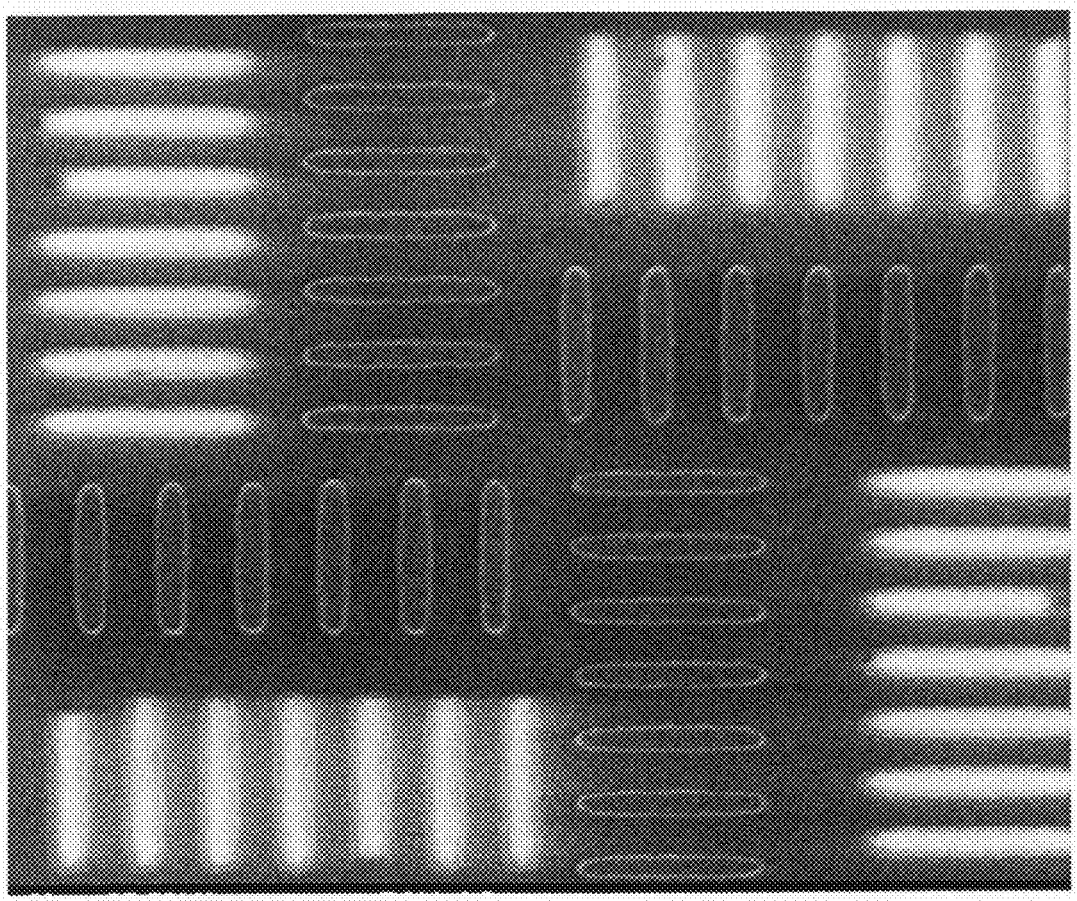
FIG. 5 is a photographic image of an SEM design relate, segmented type target in accordance with one embodiment of the present invention.

Another method for SEM overlay measurements is based upon standard optical imaging-like overlay mark designs. In FIG. 5, a photographic image of an SEM design-related, segmented type target is shown. This mark is built of fine pitch gratings on both inner and outer layers. Similarly to a standard (optical imaging) design-related, segmented mark, this mark is designed in a way that centers of symmetry (COSs) of inner and outer structures coincide. The overlay is measured as misregistration between these COSs. The algorithms for finding COSs can be similar to standard algorithms described in U.S. Pat. No. 6,921,916 issued 26 Jul. 2005 by Michael Adel et al., entitled OVERLAY MARKS, METHODS OF OVERLAY MARK DESIGN AND METHODS OF OVERLAY MEASUREMENTS, which patent is incorporated herein by reference in its entirety for all purposes. This enables automation of the SEM overlay measurements. In addition, an SEM design-related, segmented mark overlay measurement is less sensitive to image rotation appearing in the SEM. Also, 90° and 180° rotational symmetry allows easy TIS and RIS measurements and their (TIS and RIS) clear separation from the effects cause by imperfectness of the target itself.

Similarly to a SEM design-related, segmented mark, SEM Box-in-Box (BiB) marks can be designed and measured with the optical imaging-like technique (both algorithmic and automation) described herein.

Various techniques, such as those describe above and depicted in FIGS. 2, 3A, 3B, 4 and 5, may be used to measure overlay error. Other examples of suitable techniques for measuring overlay error are presented in U.S. patent application Ser. No. 10/785,396, filed Feb. 23, 2004, entitled "APPARATUS AND METHODS FOR DETECTING OVERLAY ERRORS USING SCATTEROMETRY," by Mieher, et al., which application is herein incorporated by reference in its entirety. The results of techniques may be used, in conjunction with metrics, to train a neural network.

Some such metrics involve the quantification of target quality. Described below are techniques and target structures for measuring and obtaining such metrics, such as systematic and noise metrics. Such techniques and structures may be used, for example, in connection with block 106 in FIG. 1. The target structures may assume a variety of shapes and designs.

One well known overlay target shape is the box-in-box structure. Of course, there are various types of overlay target shapes, which may also be used with the techniques of the present invention. FIG. 6A is a diagrammatic top view of an example target structure 600. As shown, the target 600 is formed from an inner box 604 and an outer box 602. The inner box 604 is typically formed in a different layer than the outer box 602. For example, at the DI-stage the inner box 604 may be a resist pattern defining the Via2-layer, while outer box 602 is formed of features in a metal 2 layer. As shown, the inner box 604 is formed from a plurality of segments 604a through 604d which are arranged in a square pattern, while the outer box is formed from a plurality of segments 602a through 602d formed in a square pattern. The overlay error is typically determined by finding a center of each box and comparing the two centers to obtain an overlay error difference. This difference is typically expressed in x and y coordinates although the difference may be expressed in other forms, such as a vector. As shown, the inner box and outer box share a same center 606, indicating that there is no overlay error between the inner and outer box. In this case, the overlay error would be 0.0.

FIG. 6B is a diagrammatic top view of an example target structure 650 that is asymmetrical. As shown, the inner box 604 has a segment 604e that differs in width from the remaining segments 604b through 604d. Although this asymmetrical target 650 results in no overlay error because the inner box 604 and outer box 602 share a same center 606, the target 650 is defective because of the asymmetry. This type of defect is referred to as a systematic error. Systematic errors can be characterized per target, and they are often of systematic nature across the wafer. Systematic errors are typically due to target asymmetry, caused by process effects such as CMP polish, metal sputtering, or photoresist effects.

An asymmetry metric may be obtained using any suitable technique. In one embodiment, portions of the target which are designed to be symmetrical with respect to each other are compared. Preferably, the systematic error metric is obtained through a comparison of the nominally symmetrical signal forms from the different parts of the target, e.g. comparison between the signal from the left outer bar and right outer bar. As the overlay tool may have some asymmetry in its optics, it is advisable to measure the Asymmetry Metrics at two orientations of the wafer: 0° and 180°. The final systematic or asymmetry metric may be calculated as:

$$\text{Asymmetry(final)}=[\text{Asymmetry}(0°)-\text{Asymmetry}(180°)]/2.$$

For the example target of FIG. 6B, the left inner bar 604e is compared to the right inner bar 604c to obtain an x-direction asymmetry metric for the inner part of the target. Likewise, the left outer bar 602a may be compared with the right outer bar 602c to determine an x-direction asymmetry metric for the outer part of the target. The top inner bar 604d may be compared to the bottom inner bar 604b to determine whether the target has a y-direction asymmetry metric. Likewise, the outer top bar 602d may be compared with the outer bottom bar 602b to determine a y-direction asymmetry metric for the outer part of the target. These different x- and y-direction asymmetry metrics may then be combined into a final asymmetry metric. Specific techniques or algorithms for measuring the asymmetry of a target through comparison include Fourier-transform techniques, derivative (slope) techniques, overlap integral techniques, and center-of-gravity techniques. These techniques for obtaining asymmetry metrics may be used in connection with embodiments of the present invention.

Another target quality metric that may be obtained in block 106 in FIG. 1 is a noise metric. FIG. 6C is a diagrammatic top view of the target 600 of FIG. 6A with a noisy background 660. As shown, the background noise is in the form of grains. However, the noise may be caused by any source of spatial noise in the image. The noise 660 may cause the apparent center of either the inner box 604 or the outer box 602 to shift in direction 667, for example. Thus the resulting overlay error may be caused by random noise instead of an actual overlay error or a systematic error. These types of errors are referred to as random errors. The random errors are due to spatial noise caused by process effects such as graininess. These noise-related errors are characterized by the fact that their effect on targets across the wafer and even on a single target are statistical in nature.

Any suitable technique for characterizing noise data may be implemented to obtain a noise metric for a target. By way of examples, the following noise determination algorithms may be used: statistical algorithms, integrated noise algorithms, integrated derivative algorithms, signal-to-noise algorithms, or spectrum of noise algorithms. Such algorithms may produce noise metrics for neural networks according to embodiments of the present invention.

Another metric that may be inputted into a neural network in accordance with the present invention is a process metric. A process metric characterizes a property of the wafer. A process metric, for example, may reflect a parameter relating to the photolithographic process. Such process metrics include values associated with post exposure bake (PEB) temperature, PEB time, bottom anti-reflective coating (BARC) thickness, development time, dose, focus and scan direction. Process metrics may also represent physical features of the wafer. Such process metrics include values corresponding to critical dimension, resist thickness, sidewall angle and wafer flatness. Wafer flatness, for example, may be expressed using a variety of metrics, such as site-based, front surface referenced (SFQR), moving average (MA), chucked height (CHK), leveling verification test (LVT), range and thickness variation (THK). Examples of process metrics suitable for use with some embodiments of the present invention are presented in Valley, et al., "APPROACHING NEW METRICS FOR WAFER FLATNESS," in Richard Silver ed., Metrology, Inspection and Process Control for Microlithography XVIII (Proceedings of SPIE Vol. 5375, SPIE, 2004) and Dusa, et al., "INTRA-WAFER CDU CHARACTERIZATION TO DETERMINE PROCESS AND FOCUS CONTRIBUTIONS BASED ON SCATTEROMETRY METROLOGY," in Kenneth Tobin ed., Data Analysis and Modeling for Process Control (Proceedings of SPIE Vol. 5378, SPIE, 2004).

Another metric that can be inputted into the neural network to predict distributed wafer characteristic is referred to as an alignment metric. In general, an alignment metric is readily available from any lithographic tool. An alignment metric is typically provided for other purposes, such as reticle alignment. An alignment metric may estimate the quality of an alignment mark. The metric may also be related to correctables that are used to calibrate a lithography tool and that were derived from a measurement of overlay error or some other parameter. An example of such a correctable was presented in blocks 112 and 116 in FIG. 1.

The above metrics are examples of known parameters that may be used to train a neural network in accordance with some embodiments of the present invention. The term "neural network" as used herein and in the claims shall be understood to include any system, including but not limited to conventional neural networks, that predicts a set of inputs from a set of outputs and that improves the accuracy of its predictions through a process of iterative self-learning. There are many types of neural networks suitable for use with the present invention, some of which are commercially available. Some of these neural networks may be hardware or software-based, situated in one apparatus or distributed across multiple platforms.

Figure 7:
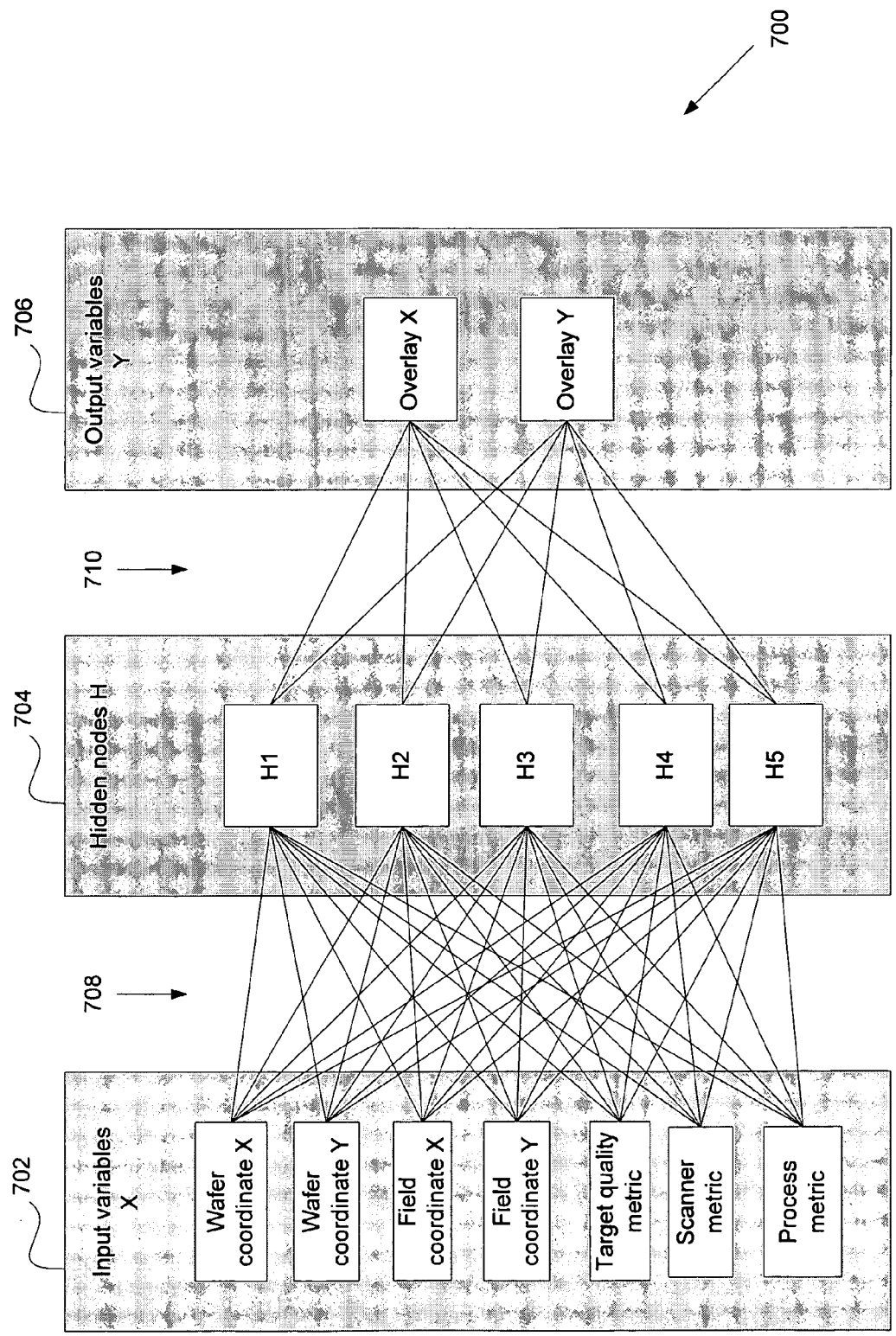
FIG. 7 is a diagram illustrating the relationship between inputs, outputs and hidden nodes within an example neural network.

FIG. 7 is a diagrammatic representation of an example neural network 700 in accordance with one embodiment of the present invention. Neural network 700 is an adaptive, iterative system for correlating sets of inputs 702 with sets of outputs 706. The inputs can include target quality metrics, alignment metrics and process metrics like those obtained in blocks 106, 108 and 110 of FIG. 1. The inputs 702 can also include wafer and field coordinates, so that the obtained overlay error values may be correlated with locations on the wafer. Inputs 702 may include other inputs or replace some of the above inputs with others.

The network 700 generally comprises a number of hidden nodes 704, such as nodes H1-H5. Hidden nodes 704 may be understood as those nodes in the neural network 700 that are not inputs 702 or outputs 706 and that are connected only to inputs 702, outputs 706, or to each other. Neural network 700 may contain many more layers and hidden nodes, but only one layer and five hidden nodes are shown for the sake of simplicity and clarity. The hidden nodes 704 are linked to the inputs 702 through connections 708. The hidden nodes 704 are related to the outputs 706 through connections 710. The connections 708 and 710 define the relationships between the inputs 702, hidden nodes 704 and output 706. Such relationships may be characterized by a combination of mathematical operations and coefficients or weights. For example, connections 708, which relate inputs 702 (represented by the variable "X" below) to hidden nodes 704 (represented by the variable "H" below), can be defined as follows:

$$H_i = S_H\left(C_i + \sum_{i=1}^{7} a_{ii} X_i\right)$$

Connections 710, which relate the hidden nodes 704 with the output variables 706 (represented by the variable "Y" below), can be defined as follows:

$$Y_K = S_Y\left(d_K + \sum_{i=1}^{5} b_{ii} H_i\right)$$

The above definitions for connections 708 and 710 are two among many possibilities. Any combination of mathematical operations, parameters, coefficients, hidden nodes, inputs and outputs may be used in connections 708 and 710.

Note that in calculating the values for hidden nodes 704 from inputs 702, the coefficient or weight $a_{ij}$ is used. Similarly, in calculating the values for the output from the hidden nodes 704, the coefficient or weight $b_{ij}$ is used. The adjustment of such coefficients plays a role in the training of neural network 700. Such training is described in greater detail below.

Figure 8:
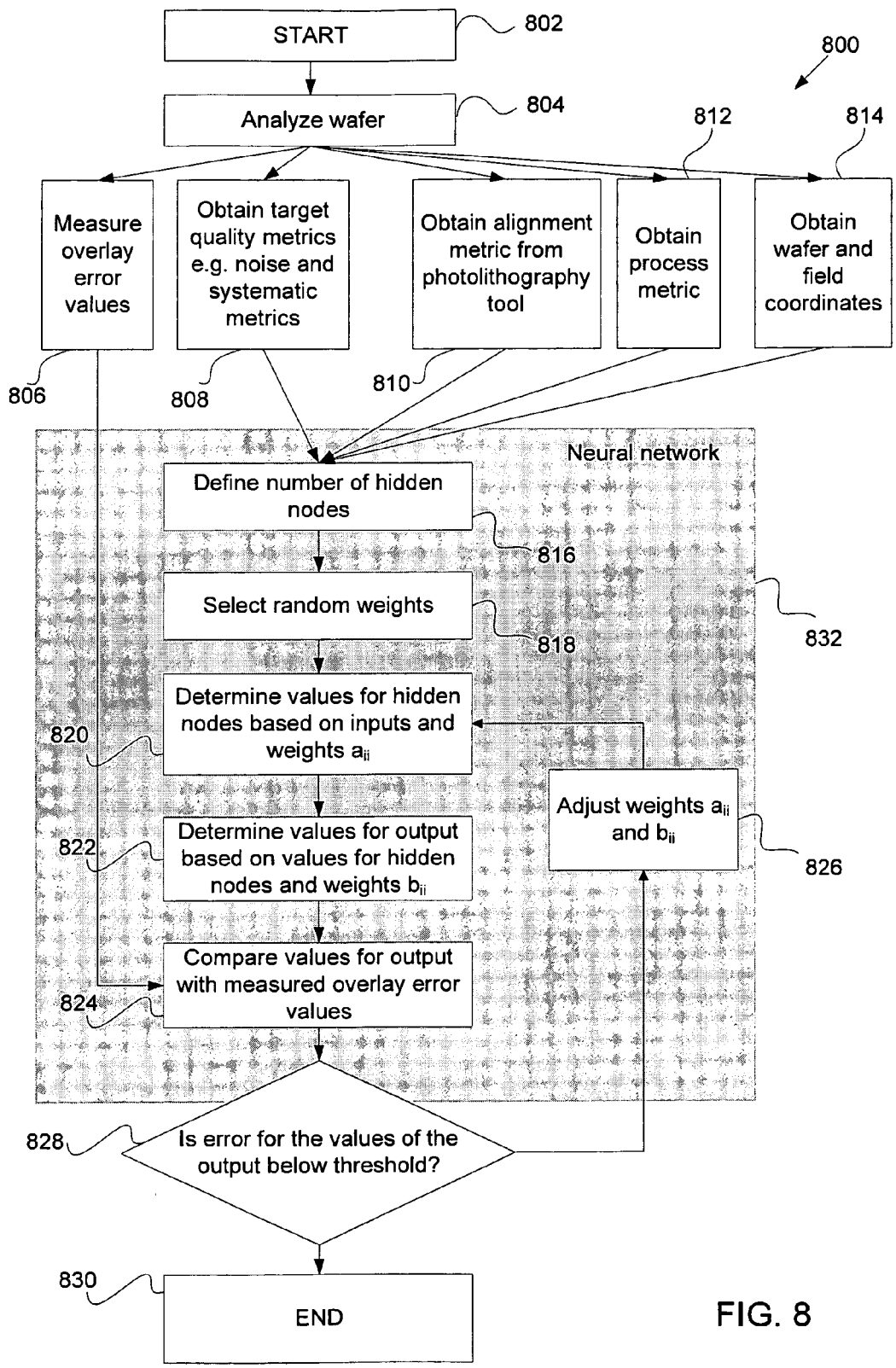
FIG. 8 is a flowchart illustrating a procedure for training an example neural network in accordance with one embodiment of the present invention.

FIG. 8 presents a diagrammatic representation of a training process 800 for neural network 832 in accordance with one embodiment of the present invention. The process begins at block 802, whereupon the wafer is analyzed (block 804) and some of the metrics mentioned above, such as target quality metrics and process metrics (blocks 808 and 812), are inputted into a neural network 832. The neural network 832 additionally receives inputs relating to wafer alignment from the photolithography tool (block 810) as well as field and wafer coordinates (block 814).

The above metrics are inputted into neural network 832, which begins the training process by defining a number of hidden nodes (block 816), corresponding to the hidden nodes discussed earlier with reference to block 704 in FIG. 7, by way of example. A range of nodes and node layers may be defined at this stage. After the hidden nodes are established, random values for weights $a_{ij}$ and $b_{ij}$ from connections 708 and 710 in FIG. 7 are chosen. Alternatively, the weights may be intelligently selected, i.e., not random, based on any suitable criteria.

In block 820, the values for the hidden nodes are determined using at least in part the inputs from blocks 808, 810, 812 and 814 and weights $a_{ij}$. This determination was earlier illustrated by connection 708 in FIG. 7, for example. In block 822, the values for the output are derived in part from the values of the hidden nodes found in block 820 and the weights $b_{ij}$ selected in block 818. The relationship between the output and the hidden nodes was also earlier presented using connection 710 in FIG. 7, for instance.

Neural network 832 is being trained to predict, based on the inputs obtained in blocks is 808, 810, 812 and 814, overlay error values for a plurality of locations on the wafer, as identified by the field and wafer coordinates (block 814). The training of neural network 832 involves generating predictions of overlay error, comparing the predictions with externally obtained values for the overlay error, and readjusting neural network 832 until it can generate reasonably accurate predictions on its own. Block 806 produces values for the overlay error (e.g., determined from overlay targets) that are used to train neural network 832. Block 806 may use a variety of overlay measurement techniques to generate the overlay error values, including those mentioned earlier in connection with FIGS. 2, 3A, 3B, 4 and 5. Block 806 may also utilize mathematical models to generate approximations of overlay error.

In block 824, the externally obtained values for the overlay error are compared with the ones generated by the neural network 832. At this stage, the overlay error values generated in block 822 by the neural network 832 are likely to be highly inaccurate, because they are based at least in part on weights randomly selected in block 818. The accuracy of the generated values is evaluated in block 828. If the evaluation results in an error that exceeds a certain threshold (or is not within a predetermined specification), the weights will be adjusted in block 826 and the training process will begin anew from block 820.

The nature of the adjustments made to the weights in block 826 may vary greatly. Parameters other than or in addition to the weights may be adjusted. Weights may be adjusted based on a variety of techniques, including back propagation. In one application of this technique, the predicted output values (e.g., the values produced by block 824) would be compared to the desired output values (e.g., the values produced by block 806.) The weights $b_{ij}$ would be adjusted based at least in part on this difference. The desired values for the hidden nodes may also be determined by extrapolating such values from the values for the output and the optimal values for $b_{ij}$. The weights $a_{ij}$ may similarly be adjusted based at least in part on the difference between the desired values for the hidden nodes and the predicted values (e.g., the values produced by block 820.) This process may be repeated for additional layers of hidden nodes, if such layers exist.

With each adjustment (block 826), new values for the hidden nodes (block 820) and the output (block 822) are produced. These values for the output are also tested (block 824), and if found unsatisfactory, new adjustments are tried (block 826.) Through many iterations and adjustments, the neural network 826 "learns" how to improve the accuracy of its predictions. Once the neural network 832 can predict overlay error with an acceptable degree of accuracy, the training process will terminate (block 830.) By the end of the training process, the neural network preferably may predict overlay error values distributed across the entire wafer or a field of the wafer.

Figure 9:
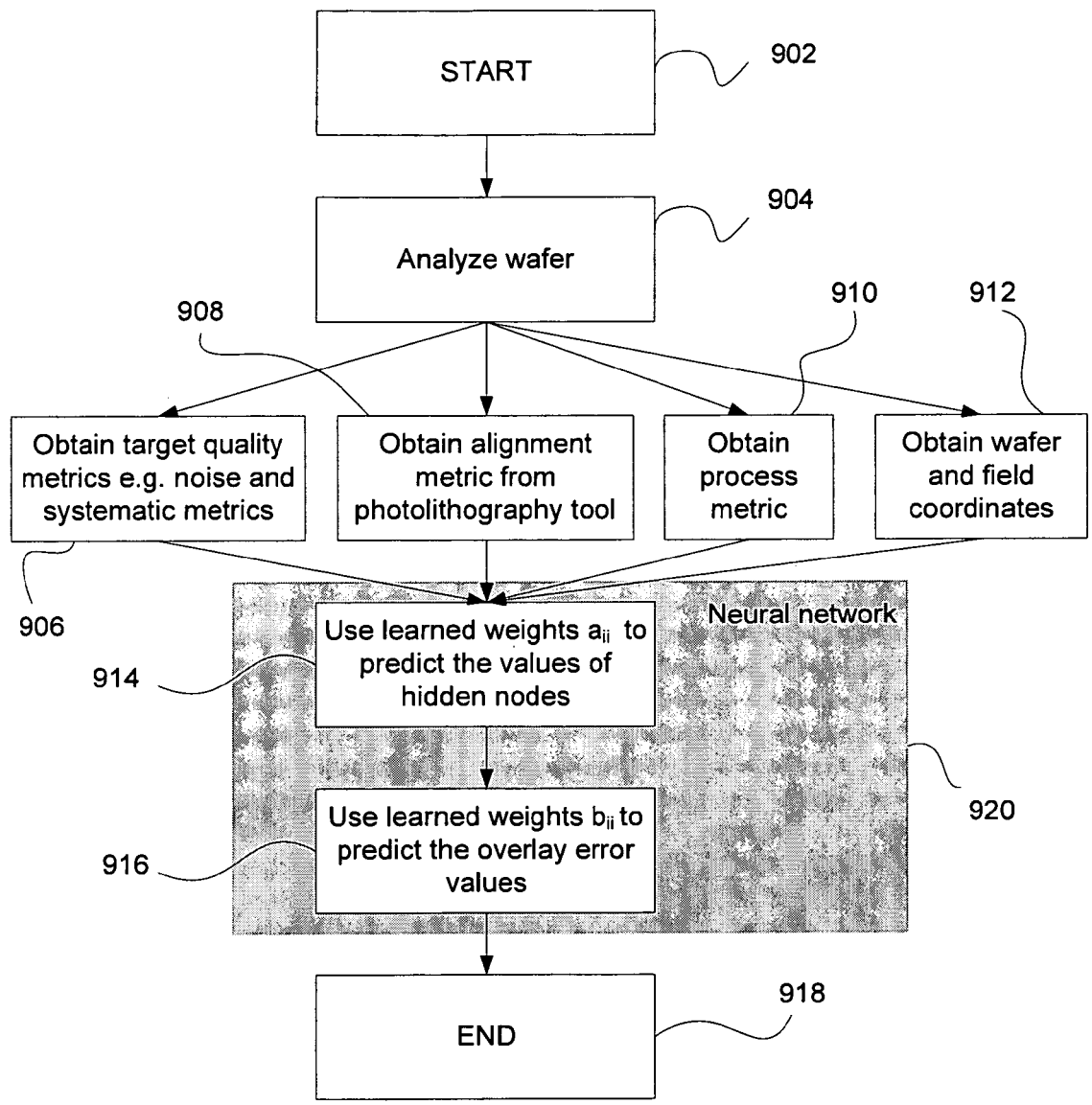
FIG. 9 is a flowchart illustrating a procedure for using a neural network to predict the overlay error of a wafer in accordance with one embodiment of the present invention.

Once a neural network has been properly trained, it may be used to predict unknown parameter values using known parameter values. FIG. 9 is a diagrammatic representation of such a process in accordance with one embodiment of the present invention. Neural network 920 has been trained to predict overlay error values in the manner of FIG. 8, by way of example. It is assumed for the purposes of this example that the internal structure of neural network 920 is similar to that of the one presented in FIG. 8. The prediction process begins at block 902, whereupon a wafer is chosen from a lot (block 904). Various metrics such as target quality metrics (block 906), an alignment metric (908) and process metrics (910) are obtained from the wafer (or lithography tool for obtaining the alignment metric), as was the case with the training process in FIG. 9. These metrics are inputted into the neural network along with wafer and field coordinates (block 912).

Neural network 920 applies weights $a_{ij}$ to the above inputs, resulting in values for various hidden nodes (block 914). Weights $b_{ij}$ are applied to the values for the hidden nodes, resulting in predictions of overlay error (block 916). The calculations of blocks 914 and 916 involving $a_{ij}$ and $b_{ij}$ may be assumed, for the purposes of simplicity, to mirror the calculations already described with respect to connections 708 and 710 in FIG. 7. Assuming that the neural network 920 was adequately trained and the metrics inputted in blocks 906, 908 and 910 are reliable, by the end of the prediction process 918, the neural network 920 should provide a reasonable approximation of the overlay error.

Trained neural network 920 can thus predict overlay error with nothing more than the inputs from blocks 906, 908, 910 and 912. Neural network 920 thus does not depend on an optical property of a lithography tool. Many conventional models for approximating overlay error depend on such properties. Such dependence is problematic, because different lithography tools have different properties, requiring readjustment of the model. If a conventional model does not take into account a lens aberration in a lithography tool, for example, the model's predictive capability may be reduced. Trained neural network 920, however, does not suffer from such a dependency and need not take into account the optical properties of a lithography tool. Trained neural network 920 also has the ability to correlate enormous numbers of inputs with outputs and to find causal connections that may otherwise be difficult to detect.

The training process 800 in FIG. 8 and the prediction process 900 in FIG. 9 may be implemented in software or hardware. The processes may be incorporated, for example, into a device, such as a computer or measuring tool, equipped with at least one processor and at least one memory.

Figure 10:
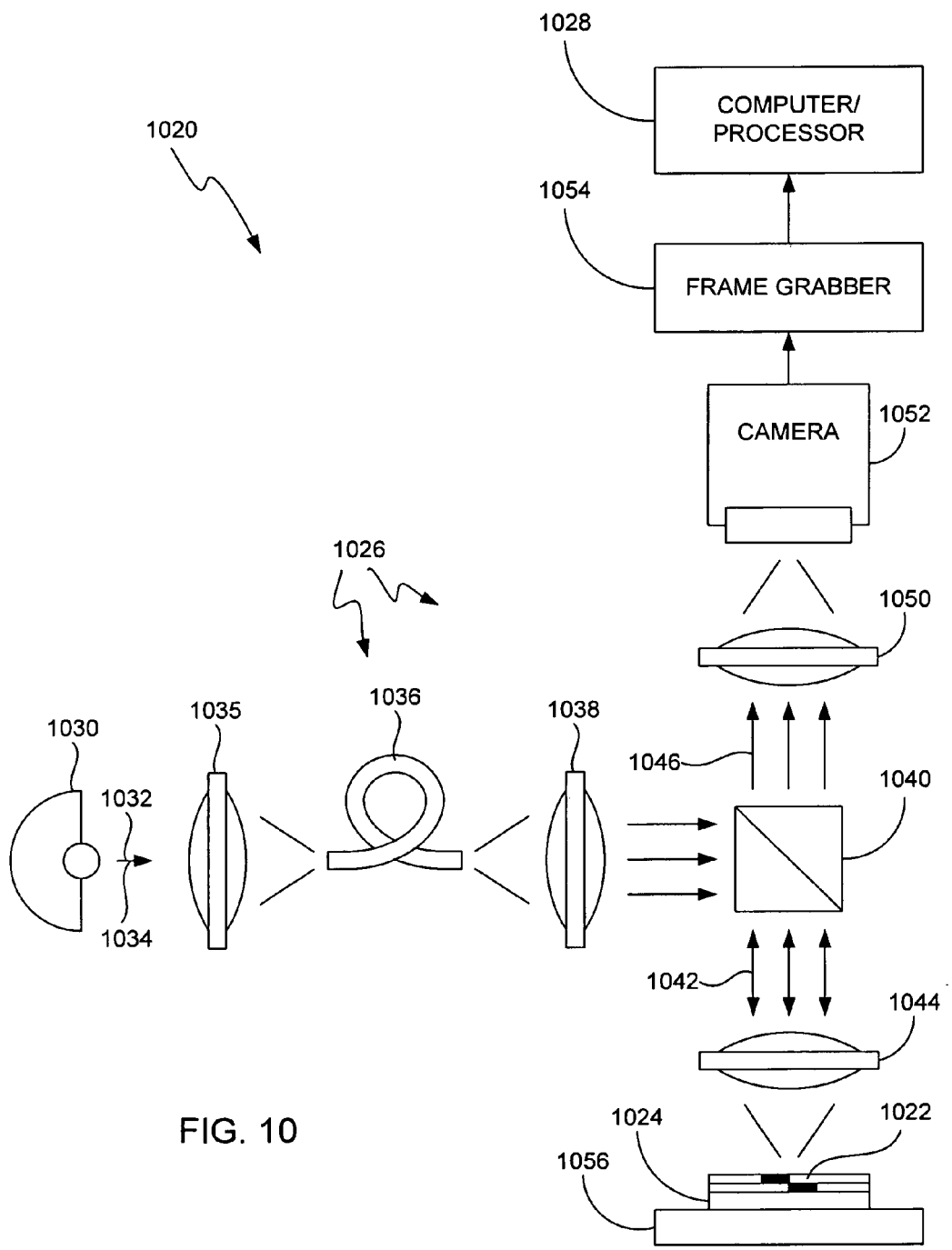
FIG. 10 is a simplified diagram of an overlay measurement system, in accordance with one embodiment of the present invention.

As noted earlier, the training process 800 in FIG. 8 and prediction process 900 in FIG. 9 involve the input of various types of data into the neural network. This data may comprise target quality metrics (block 906 in FIG. 9) and process metrics (block 910.) The data may also comprise an approximation of the overlay error (block 806 in FIG. 8.) Such data may be obtained using various types of equipment. A scanning electron microscope (SEM), for example, may be used to measure overlay. FIG. 10 provides a diagrammatic representation of an overlay measurement system or metrology tool 1020 that uses imaging to collect data from a wafer.

Imaging is a very developed technology with large user acceptance, and components that are readily available to the user. As is generally well known, imaging is an effective way to collect a large amount of information at any one time. That is, all points within the mark may be observed simultaneously. Furthermore, imaging allows a user to see what is actually being measured on the wafer. The dimensions of various components are exaggerated to better illustrate this embodiment.

The overlay measurement system 1020 may be used to determine various parameters, including overlay error, systematic metrics, and noise metrics. The overlay measurement tool 1020 may be used, for example, to train the neural network 832 in FIG. 8 and provide the data related to blocks 104 and 106 in FIG. 1, blocks 806 and 808 in FIG. 8 and block 906 in FIG. 9. The overlay measurement tool 1020 determines such parameters via one or more overlay targets 1022 disposed on a wafer 1024. In most cases, the overlay targets 1022 are positioned within the scribe lines of the wafer 1024. As is generally well known, scribe lines are the areas of the wafer used for sawing and dicing the wafer into a plurality of dies. It should be noted, however, that this is not a limitation and that the position of the targets may vary according to the specific needs of each device design. For example, the designer of the semiconductor device may choose to insert overlay targets inside the area of the active devices. As shown, the overlay measurement system 1020 includes an optical assembly 1026 and a computer system 1028 having a processor and one or more memory devices. The optical assembly 1026 is generally arranged to capture the images of the overlay target 1022. The computer, on the other hand, is generally arranged to calculate the relative displacement and target diagnostics of the elements of the overlay target from the captured images, as well as training a neural net to predict overlay errors or the like.

In the illustrated embodiment, the optical assembly 1026 includes a light source 1030 (e.g., incoherent or coherent, although incoherent is generally preferred) arranged to emit light 1032 along a first path 1034. The light 1032 is made incident on a first lens 1035, which focuses the light 1032 onto a fiber optic line 1036 configured to pass the light 1032 there through. When the light 1032 emerges from fiber optic line 1036, it then passes through a second lens 1038, which is arranged to image the end of the optical fiber 1036 to a suitable optical plane in the optical system, such as the entrance pupil of the objective lens 1044. The light 1032 then continues on its path until it reaches a beam splitter cube 1040, which is arranged to direct the light onto a path 1042.

The light 1032 continuing along path 1042 is made incident on an objective lens 1044, which relays the light 1032 onto the wafer 1024.

The light 1032, which reflects off of the wafer 1024, is then collected by the objective lens 1044. As should be appreciated, the reflected light 1032 that is collected by the objective lens 1044 generally contains an image of a portion of the wafer 1024, as for example, the image of the overlay target 1022. When the light 1032 leaves the objective 1044, it continues along path 1042 (upward in FIG. 14) until it reaches the beam splitter cube 1040. In general, the objective lens 1044 manipulates the collected light in a manner that is optically reverse in relation to how the incident light was manipulated. That is, the objective lens 1044 re-images the light 1032 and directs the light 1032 towards the beam splitter cube 1040. The beam splitter cube 1040 is arranged to direct the light 1032 onto a path 1046. The light 1032 continuing on path 1046 is then collected by a tube lens 1050, which focuses the light 1032 onto a camera 1052 that records the image of the wafer 1024, and more particularly the image of the target 1022. By way of example, the camera 1052 may be a charge couple device (CCD), a two-dimensional CCD, or linear CCD array. In most cases, the camera 1052 transforms the recorded image into electrical signals, which are sent to the computer 1028. After receiving the electrical signals, the computer 1028 performs analysis using algorithms that calculate the overlay error target, metrics of the image as described above, train a neural network to predict overlay error, etc.

The system 1020 further includes a frame grabber 1054 that works with the computer 1028 and the camera 1052 to grab images from the wafer 1024. Although the frame grabber 1054 is shown as a separate component, it should be noted that the frame grabber 1054 may be part of the computer 1028 and/or part of the camera 1052. The function of the frame grabber 1054 is generally to convert the signals from camera 1052 into a form usable by the computer 1028. The overlay metrology event is divided into two functions—target acquisition and image grab. During target acquisition, the frame grabber 1054 and computer 1028 cooperate with a wafer stage 1056 to place the target in focus and to position the target as closes as possible to the center of the field of view (FOV) of the metrology tool. In most cases, the frame grabber grabs a plurality of images (e.g., not the images used to measure overlay) and the stage moves the wafer between these grabs until the target is correctly positioned in the X, Y and Z directions. As should be appreciated, the X&Y directions generally correspond to the field of view (FOV) while the Z direction generally corresponds to the focus. Once the frame grabber determines the correct position of the target, the second of these two functions is implemented (e.g., image grab). During image grab, the frame grabber 1054 makes a final grab or grabs so as to capture and store the correctly positioned target images, i.e., the images that are used to determine overlay and target diagnostics.

After grabbing the images, information is extracted from the grabbed images to determine the overlay error. Various algorithms may then be used to determine the registration error between various layers of a semiconductor wafer. For example, a frequency domain based approach, a space domain based approach, Fourier transform algorithms, zero-crossing detection, correlation and cross-correlation algorithms and others may be used.

Algorithms proposed for determining overlay and target diagnostic metrics, such as asymmetry, via the marks described herein (e.g., marks that contain periodic structures) can generally be divided into a few groups. For instance, one group may relate to phase retrieval based analysis. Phase retrieval based analysis, which is often referred to as frequency domain based approaches, typically involves creating one dimensional signals by collapsing each of the working zones by summing pixels along the lines of the periodic structure. Examples of phase retrieval algorithms that may be used are described in U.S. Pat. No. 6,023,338 issued to Bareket, U.S. patent application Ser. No. 09/603,120 filed on Jun. 22, 2000, and U.S. patent application Ser. No. 09/654,318 filed on Sep. 1, 2000, all of which are incorporated herein by reference.

Yet another phase retrieval algorithm that may be used is described in U.S. application Ser. No. 09/697,025 filed on Oct. 26, 2000, which is also incorporated herein by reference. The phase retrieval algorithm disclosed therein decomposes signals into a set of harmonics of the basic signal frequency. Quantitative comparison of different harmonics' amplitudes and phases provide important information concerning signals' symmetry and spectral content. In particular, the phase difference between the 1st and 2nd or higher harmonics of the same signal (calibrated with their amplitudes) measures the degree of the signal asymmetry. The major contributions to such asymmetry come from the optical misalignment and illumination asymmetry in the metrology tool (tool induced shifts), as well as process induced structural features (wafer induced shifts). Comparing this misregistration between the phases of the 1st and the 2nd harmonics for the signals acquired from different parts of the field of view on the same process layer may provide independent information about optical aberrations of the metrology tool. Finally, comparing these misregistrations from measurements at a given orientation with those obtained after rotating the wafer 180 degrees allows separation of the tool induced and wafer induced shifts due to asymmetry.

Yet another phase retrieval algorithm that may be used is Wavelet analysis. Wavelet analysis is somewhat similar to that described in the section above, however, now a dynamic window is moved across the one dimensional signal and the phase estimation is carried out in a more localized way. This is particularly of interest with use in the case of a chirped periodic structure.

Another group may relate to intensity correlation based methods. In this approach the centers of symmetry for each process layer is found separately by calculating the cross covariance of one signal with the reversed signal from the opposite part of the mark, from the same process layer. This technique is similar to techniques used today with regards to box in box targets.

The above techniques are brought by way of example and have been tested and demonstrated good performance. Other alternative algorithmic methods for calculation of overlay include other variations of auto & cross correlation techniques, error correlation techniques, error minimization techniques, such as minimization of absolute difference, minimization of the square of the difference, threshold based techniques including zero cross detection, and peak detection. There are also dynamic programming algorithms which can be used for searching for the optimal matching between two one-dimensional patterns. As mentioned above, the analysis algorithms and approaches may be utilized with respect to all of the various overlay marks described in the previous section.

Importantly, it should be noted that the above diagram and description thereof is not a limitation and that the overlay image system may be embodied in many other forms. For example, it is contemplated that the overlay measurement tool may be any of a number of suitable and known imaging or metrology tools arranged for resolving the critical aspects of overlay marks formed on the surface of the wafer. By way of example, overlay measurement tool may be adapted for bright field imaging microscopy, darkfield imaging microscopy, full sky imaging microscopy, phase contrast microscopy, polarization contrast microscopy, and coherence probe microscopy. It is also contemplated that single and multiple image methods may be used in order to capture images of the target. These methods include, for example, single grab, double grab, single grab coherence probe microscopy (CPM) and double grab CPM methods. These types of systems, among others, are readily available commercially. By way of example, single and multiple image methods may be readily available from KLA-Tencor of San Jose, Calif. Non-imaging optical methods, such as Scatterometry, may be contemplated, as well as non-optical methods such as SEM (Scanning Electron Microscope) and non-optical stylus-based instruments, such as AFM (Atomic Force Microscope) or profilometers.

Regardless of the system's configuration for practicing techniques of the present invention, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of targets, overlay error values, target diagnostic metrics and other metrics, predicted overlay error values, data related to the use and training of a neural network, as well as values for particular operating parameters of the inspection or metrology system.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

The invention claimed is:

1. A method of predicting a plurality of parameter values distributed over at least a portion of a wafer, the method comprising:
   providing a plurality of known parameter values measured from a plurality of targets at specific measurement locations on the wafer;
   training a neural network using the measured, known parameter values so that the trained neural network is configured to predict a plurality of predicted parameter values such that a subset of the predicted parameter values which correspond to the specific measurement locations are within a predefined error function of the corresponding measured, known parameter values;
   using the trained neural network to predict the predicted parameter values at the plurality of locations distributed across at least a portion of the wafer; and
   determining whether the wafer passes or fails based on the predicted parameter values predicted by the trained neural network.

2. A method as recited in claim 1, wherein the predicted parameter values are distributed across the entire wafer or across a field of the wafer.

3. A method as recited in claim 1, wherein the predicted parameter values comprise a plurality of overlay error values or critical dimension values.

4. A method as recited in claim 1, wherein training the neural network and using the trained neural network includes inputting at least one target metric of at least one of the targets of the wafer into the neural network and the trained neural network.

5. A method as recited in claim 1, wherein training the neural network and using the trained neural network includes inputting at least one noise metric that quantifies a background characteristic of the at least one target of the wafer, at least one systematic metric of the at least one target of the wafer, an alignment metric from a photolithography tool into the neural network and the trained neural network, and at least one process metric that characterizes a property of the wafer into the neural network and the trained neural network.

6. A method comprising:
providing a plurality of known parameter values measured from a wafer or obtained from a process for forming a wafer; and
using a trained neural network model to predict a plurality of unknown parameter values based on the known parameter values.

7. A method as recited in claim 6, wherein using a trained neural network model is performed without use of a model of the photolithography tool and without depending on an optical property of a photolithography tool.

8. A method as recited in claim 7, wherein the optical property includes a lens aberration characteristic.

9. An apparatus for predicting a plurality of parameter values distributed over at least a portion of a wafer, the apparatus comprising:
one or more processors;
one or more memory, wherein at least one of the processors and memory are configured for:
providing a plurality of known parameter values measured from a plurality of targets at specific measurement locations on the wafer;
training a neural network using the measured, known parameter values so that the trained neural network is configured to predict a plurality of predicted parameter values such that a subset of the predicted parameter values which correspond to the specific measurement locations are within a predefined error function of the corresponding measured, known parameter values;
using the trained neural network to predict the predicted parameter values at the plurality of locations distributed across at least a portion of the wafer; and
determining whether the wafer passes or fails based on the predicted parameter values predicted by the trained neural network.

10. An apparatus as recited in claim 9, wherein the predicted parameter values are distributed across the entire wafer or across a field of the wafer.

11. An apparatus as recited in claim 9, wherein the predicted parameter values comprise a plurality of overlay error values or critical dimension values.

12. An apparatus as recited in claim 9, wherein training the neural network and using the trained neural network includes inputting at least one target metric of at least one of the targets of the wafer into the neural network and the trained neural network.

13. An apparatus as recited in claim 9, wherein training the neural network and using the trained neural network includes inputting at least one noise metric that quantifies a background characteristic of the at least one target of the wafer, at least one systematic metric of the at least one target of the wafer, an alignment metric from a photolithography tool into the neural network and the trained neural network, and at least one process metric that characterizes a property of the wafer into the neural network and the trained neural network.

14. An apparatus comprising:
one or more processors;
one or more memory, wherein at least one of the processors and memory are configured for:
providing a plurality of known parameter values measured from a wafer or obtained from a process for forming a wafer; and
using a trained neural network model to predict a plurality of unknown parameter values based on the known parameter values.

15. An apparatus as recited in claim 14, wherein using a trained neural network model is performed without use of a model of the photolithography tool and without depending on an optical property of a photolithography tool.

16. An apparatus as recited in claim 14, wherein the optical property includes a lens aberration characteristic.

17. An apparatus as recited in claim 14, wherein the known parameter values are obtained from a process for forming a wafer.

18. An apparatus as recited in claim 17, wherein the known parameter values comprise one or more of the following values: post exposure bake (PEB) temperature, PEB time, bottom anti-reflective coating (BARC) thickness, development time, dose, focus, or scan direction values from a photolithography tool for forming a wafer.

19. An apparatus as recited in claim 14, wherein the known parameter values characterize a property of the wafer.

20. An apparatus as recited in claim 19, wherein the known parameter values comprise one or more of the following: overlay, critical dimension, side wall angle, photoresist thickness, or wafer flatness values.

21. An apparatus as recited in claim 19, wherein the unknown parameter values comprise overlay or critical dimension values.

22. A method as recited in claim 6, wherein the known parameter values are obtained from a process for forming a wafer.

23. A method as recited in claim 22, wherein the known parameter values comprise one or more of the following values: post exposure bake (PEB) temperature, PEB time, bottom anti-reflective coating (BARC) thickness, development time, dose, focus, or scan direction values from a photolithography tool for forming a wafer.

24. A method as recited in claim 6, wherein the known parameter values characterize a property of the wafer.

25. A method as recited in claim 24, wherein the known parameter values comprise one or more of the following: overlay, critical dimension, side wall angle, photoresist thickness, or wafer flatness values.

26. A method as recited in claim 6, wherein the unknown parameter values comprise overlay or critical dimension values.

* * * * *